PULSE AMPLIFIER

Filed Feb. 7, 1955 2 Sheets-Sheet 1

INVENTOR.
CHARLES R. DEMING,
BY Henry Hyman
ATTORNEY.

May 1, 1956 C. R. DEMING 2,744,169

PULSE AMPLIFIER

Filed Feb. 7, 1955 2 Sheets-Sheet 2

INVENTOR.
CHARLES R. DEMING,
BY Henry Heyman
ATTORNEY.

United States Patent Office 2,744,169

Patented May 1, 1956

2,744,169

PULSE AMPLIFIER

Charles Reed Deming, Venice, Calif., assignor to Hughes Aircraft Company, Culver City, Calif., a corporation of Delaware Application February 7, 1955, Serial No. 486,632

5 Claims. (Cl. 179—171)

This invention relates to electronic circuits and in particular to a pulse amplifier circuit wherein fast rise and fall of pulse is possible with a minimum slope.

A wide dynamic range and faithful reconstruction of a pulse waveform applied to it are among the most desirable features of a pulse amplifier. It is necessary in modern electronic apparatus that pulse amplifiers be capable of creating pulses of almost instantaneous rise and fall. At any rate the slope of the rise and fall of pulses must be a minimum.

A further requirement of pulse amplifiers in modern electronic equipment is that there be low stand-by current. That is, the quiescent current in the absence of pulses should be a low value. This is particularly desirable in pulse circuits operating over a low duty cycle where average power used may be small.

It is also desirable that such a pulse amplifier have amplitude control capabilities so that the height of the pulse may be accurately known.

It is an object of this invention to provide a pulse amplifier circuit in which a sharp rise and fall of current is possible without deterioration.

It is a further object of this invention to provide a pulse amplifier capable of following sharp rise and fall of pulse currents and having a low stand-by current.

It is another object of this invention to provide a pulse amplifier in which the desirable impedance characteristics of the cathode follower and the desirable voltage output and gain characteristics of the anode loaded amplifier are combined in a single circuit arrangement.

These and other objects of this invention along with the novel features of its organization and operation and their advantages are set forth in the following specification considered in connection with the accompanying drawings which illustrate preferred embodiments of the invention by way of example. It is expressly understood, however, that the drawings are for illustrative purposes only and are not intended as defining the limits of the invention. The scope of the invention is pointed out in the appended claims.

This invention may briefly be described as an amplifier circuit having a low quiescent current and capable of high values of current in either the positive or negative direction, in short a pulse amplifier capable of extremely rapid rise and fall of voltage.

A cathode follower, as is well-known, is capable of supplying a high current for rapid positive-going changes in output voltage, but is limited for negative-going changes in output voltage through the cathode load circuit. At best, the cathode follower has a gain of unity, and is generally somewhat less than unity.

In the plate loaded amplifier the situation is reversed. It is the negative going change in voltage which is more effectively generated and the positive going changes which are limited. Additionally the plate loaded amplifier is capable of gain values greater than unity.

In both the plate loaded and cathode follower types of amplifier, if the load value is large, power losses are minimized, but this is at the expense of the response of the amplifier in the unfavorable direction of current change.

The unfavorable direction is a negative going waveform for a cathode follower and a positive going waveform for a plate loaded amplifier.

A two stage circuit has been devised incorporating a cathode follower amplifier and another amplifier which is the load circuit for the cathode follower.

Figures 1, 2, 3:
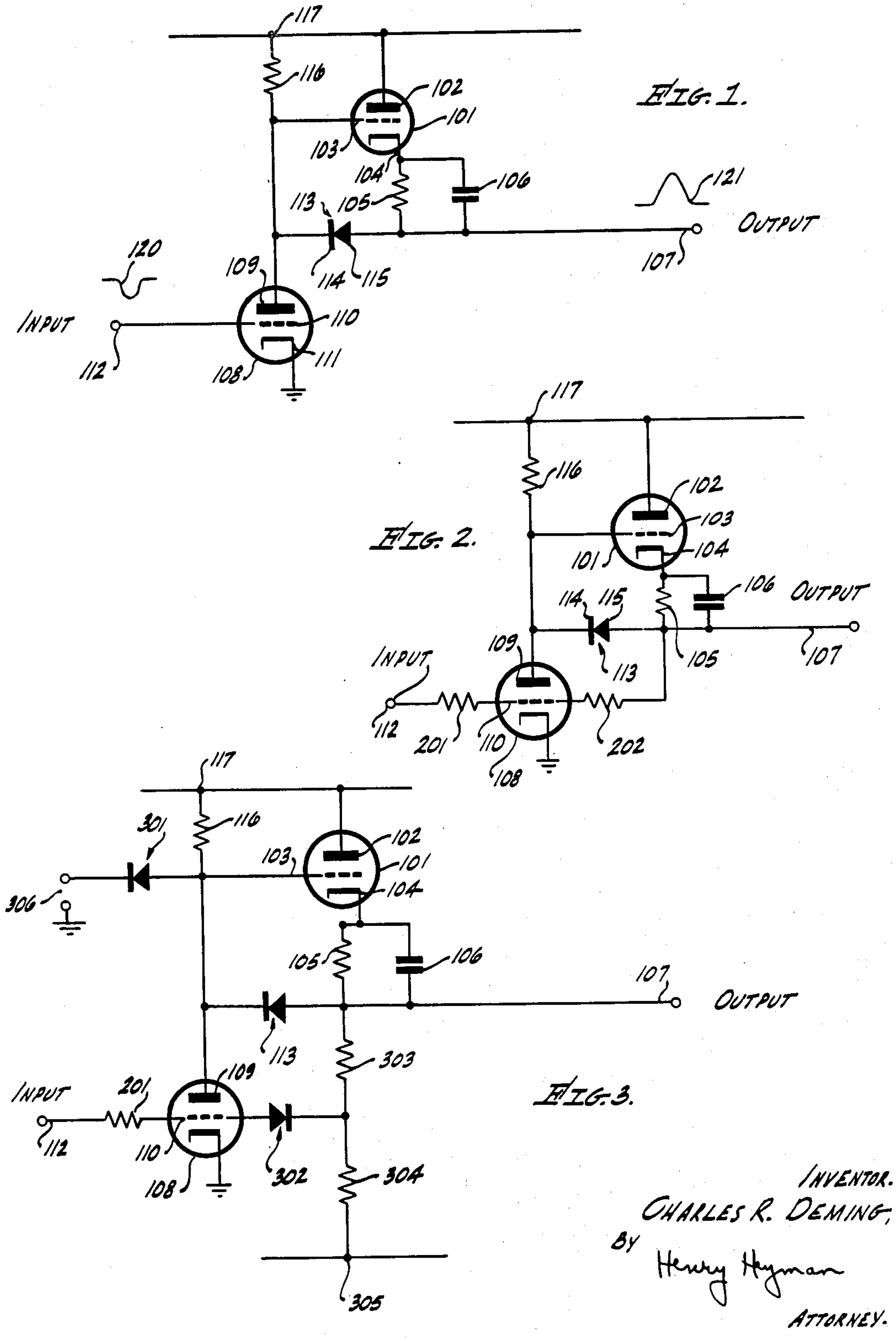
Fig. 1 is a circuit diagram of a cathode follower and plate loaded amplifier combined as a pulse amplifier in accordance with this invention.
Fig. 2 is a circuit diagram of an embodiment of the pulse amplifier of this invention showing certain features thereof for amplitude control.
Fig. 3 is a circuit diagram of an embodiment of this invention to show additional features thereof for amplitude control.

An example of this circuit is shown in Fig. 1 wherein 101 is a cathode follower amplifier having an anode 102, control grid 103 and cathode 104. A cathode bias resistor 105 and by-pass capacitor 106 are connected in parallel between cathode 104 and an output terminal 107. Another triode vacuum tube 108 has its anode 109 connected to grid 103 of cathode follower 101, its grid 110 connected to an input circuit 112 and its cathode 111 connected to ground. A diode 113 is connected with its cathode 114 to the junction of anode 109 with grid 103 and its anode 115 connected to the output circuit 107. A resistor 116 is connected between anode 109 and a source 117 of positive potential with respect to grounded anode 102 of cathode follower 101 is also connected to source 117.

A modification of the circuit of Fig. 1 is shown in Fig. 2. All elements of Fig. 2 which correspond to elements of Fig. 1 bear reference characters in Fig. 2 identical with those of the same elements in Fig. 1. In addition to the elements common to the previous figure a resistor 201 is provided in the circuit of Fig. 2 connected between input 112 and grid 110 and resistor 202 is connected between grid 110 and output circuit 107.

In Fig. 3 a circuit diagram of a further embodiment of this invention is shown. Here again elements of Fig. 3 which are identical to those of Fig. 1 bear identical reference characters in Fig. 3 to those of Fig. 1, or Fig. 2 wherever applicable. In Fig. 3 it may be seen that anode 109 of triode 108 is not connected to grid 103 of triode 101 in exactly the same manner as in the other figures. Instead a diode 301 is connected with its anode to grid 103 and its cathode to a source of bias potential 306. A diode 302 is connected with its cathode to grid 110 and its anode to the junction of series connected resistors 303 and 304. The series connected resistors 303 and 304 are connected between output connection 107 and a source of negative potential with respect to ground at 305.

Figure 4:
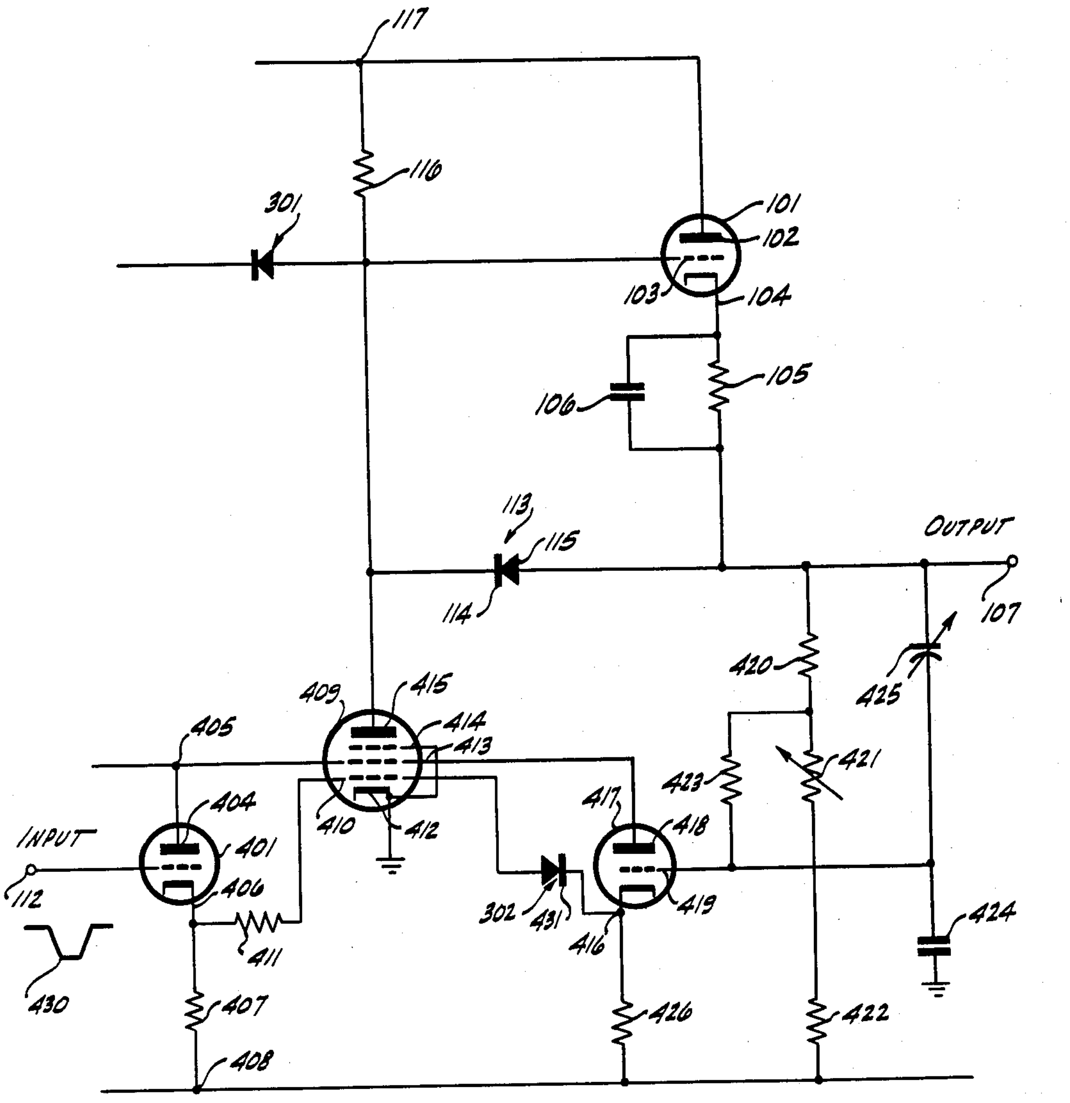
Fig. 4 is a circuit diagram of an exemplary pulse amplifier incorporating the several features of this invention.

Referring now to Fig. 4, there is shown an embodiment of this invention as incorporated in an apparatus designed to test storage type cathode ray devices. In Fig. 4 identical reference characters are used to identify elements of Fig. 4 which correspond to elements of the previous figures. In Fig. 4 an input triode cathode follower is shown at 401. The grid 402 of triode 401 is coupled to an input terminal 112. The anode 404 of triode 401 is connected to a source 405 of positive potential with respect to ground. Between the cathode 406 and a source 408 of negative potential with respect to ground a cathode bias resistor 407 is connected. A pentode 409 is coupled by its control grid 410 through an isolation resistor 411 to the cathode 406 of triode 401. The cathode 412 of pentode 409 is grounded. The screen 413 of pentode 409 is coupled to positive potential source 405. The suppressor grid 414 of pentode 409 is coupled to cathode 410. The anode 415 of pentode 409 is connected to grid 103 of triode 101. The anode 102 of triode 101 is coupled to source 117 of positive potential. Control grid 410 of pentode 409 is also coupled by diode 302 to the cathode 416 of a triode 417. The anode 418 of triode 417 is connected to source 405 of positive potential. Control grid 419 of triode 417 is coupled to a frequency compensating and amplitude control network including resistors 420, 421, 422, 423 and capacitors 424 and 425. Capacitor 424 is fixed. Capacitor 425 is variable. The capacitors 424 and 425 are connected in series. The fixed capacitor is connected to ground and the variable capacitor is connected to output terminal 107. Control grid 419 is connected to the junction of capacitors 424 and 425. Resistors 420, 421 and 422 are connected in a series string with the variable resistor 421 connected between fixed resistors 420 and 422. The series string is connected between output terminal 107 and source 408 of negative potential. Resistor 420 has its free end connected to output terminal 107 and resistor 422 its free end connected source 408. Resistor 423 is connected between control grid 419 and the junction of resistor 420 with variable resistor 421. A cathode bias resistor 426 is connected between cathode 416 and negative potential source 408.

The operation of the circuits of this invention is described with reference to the example given in Fig. 1. This figure shows a two-tube circuit in which the advantages of the cathode follower and of the plate loaded amplifier are utilized to provide uniform rise and fall of the output signals.

In the circuits of Fig. 1 in the normal quiescent state there is a residual anode current in both tubes. The anode current follows two paths, one through tube 101, cathode resistor 105, diode 113 and tube 108. The second path is through resistor 116 and tube 108. When a negative going signal 120 is applied to input 112 and appears on grid 110 of tube 108, this results in reduction of the quiescent plate current of tube 108. Accordingly, there is a rise in voltage with respect to ground at anode 109. Grid 103 of tube 101 rises at the same time as anode 109 since they are connected together. Triode 101 conducts more strongly and its cathode 104 rises correspondingly. Thus, there is a voltage rise at output circuit 107 to correspond with the negative going signal applied to input 112.

Diode 113 is poled so as to be normally conducting slightly when connected as is shown in Fig. 1. The rise in voltage of anode 109 results in reduced conduction of diode 113 towards cutoff. It may be seen that the stronger the negative going signal applied at input 112 the greater the rise in the voltage at anode 109 towards the B+ potential at 117. Correspondingly, cathode 114 of diode 113 may be cut off when the voltage at cathode 114 becomes more positive than the output terminal. When the input signal of grid 110 changes in the positive direction anode 109 falls in potential with respect to ground. Diode 113 becomes more conductive. Thus, the load current now discharges through diode 113 and to ground through tube 108 in series with diode 113. Now, as a result of the more negative signal appearing at grid 103 tube 101 draws less current. It can be seen, therefore, that diode 113 along with tube 108 are carrying all of the current. The resultant output waveform is shown at 121.

The circuit of Fig. 2 to which reference is now made operates essentially identically with that of Fig. 1 described just above. The basic circuit differences are the resistor 202 and the resistor 201. Resistors 201 and 202 provide a voltage feedback path from the output 107 to the input 112. The grid 110 of tube 108 is connected at the junction of the two resistors 201 and 202. Therefore, when a negative going signal is applied to grid 110 through resistor 201 there is a rise in voltage at the plate 109 and as previously described the voltage at output 107 also rises. A portion of this rise, 180° out of phase with the input signal at grid 110, is applied to grid 110 through resistor 202 in the manner well-known to the art as degenerative voltage feedback. The degenerative feedback results in improved waveform fidelity of response of the amplifier. A positive going waveform would be acted upon by the feedback in the same degenerative fashion. The gain of this amplifier is likewise reduced by the feedback, as would be the case in any application of degenerative feedback in an amplifier. The advantages of the feedback are increased signal-to-noise-ratio, improved waveform linearity and overall gain stability. In the circuit of Fig. 3 an application of this invention is shown particularly adaptable to pulse waveforms having sharply rising and falling voltage components. Again the basic circuit operation is similar to that described above with respect to Fig. 1. As shown in Fig. 3 means are provided for limiting the amplitudes of waveforms in the circuit both in their positive directions and in their negative directions so as to effect substantially rectangular waveforms at the output. Input signals to the amplifier as shown in Fig. 3 need not necessarily be rectangular. A diode 302 is provided to limit the lower excursion of any signal appearing at the output 107. This is accomplished by applying a negative potential to grid 110 from voltage divider networks 303 and 304 between negative potential supply 305 and the output 107. This negative potential is applied through diode 302. Diode 302 is poled so that it will become conductive when the negative excursion at the junction of resistors 303 and 304 becomes more negative than grid 110.

Diode 301 is provided to limit the positive excursion of grid 103 to a predetermined potential applied through the diode 301 from a source of positive potential 306. Diode 301 is poled so that it will become conductive when the voltage at 103 exceeds the voltage at source 306.

The circuit shown in Fig. 4 is an advanced embodiment of the circuit shown in Fig. 3. Here, this invention is employed in a circuit adapted to provide amplification of input signals which may be such as shown at 430 to obtain rectangularly shaped output signals.

The operation of those portions of the circuit of Fig. 4 which correspond to the elements in Figs. 1 thru 3 have been previously discussed. A cathode follower 401 is employed at the input of the circuit to provide isolation of the pulse amplifier from the signal source. A pentode 409 is employed in the cathode follower load circuit. The cathode follower 101 is a triode. Another triode 417 is employed to isolate the amplitude control network from the remainder of the circuit. The capacitors 425 and 424 are a frequency compensation network for the amplitude control circuit.

The operation of the circuit of Fig. 4 may be described as follows: The input circuit 112 is normally at ground potential the output voltage level is held at the base line value of the applied pulse 430 by negative feedback through diode 302 to appropriately bias tube 409. The negative going input pulse 430 results in plate current cut-off of tube 409. The plate voltage of tube 409 and the grid voltage of tube 101 rise to the value of the potential applied at 306. The cathode circuit of tube 101 and output 107 likewise rise to the voltage at 306. This condition remains as long as the pulse 430 maintains tube 409 at cut-off. When the pulse 430 returns to zero the grid 410 of tube 409 also returns to zero. This is because diode 302 is still non-conductive due to the fact that a portion of the positive output pulse is applied to the cathode 431 of diode 302. At zero potential on its grid 410, tube 409 conducts heavily through diode 113 from the load circuit, lowering the voltage at the output 107. As the output 107 reaches the value corresponding to the baseline of the pulse the cathode 431 of diode 302 reaches zero volts. Further negative going voltage in the output 107 applies bias to tube 101 through diode 302 to limit the negative value to the quiescent value, ending the output pulse.

In practical applications of the circuit of Figure 4 an output pulse rise of 100 volts in 0.1 microsecond and fall to quiescent value in about 0.2 microsecond has been obtained.

There has been described a novel and an efficient pulse amplifier comprising a cathode follower and plate loaded type of amplifier in a circuit arrangement which provides a wide dynamic range of pulse amplification. The circuit has been described in its elementary form and with modifications to provide linear operation for sine wave or similar waveforms and to provide for substantially rectangular pulse operation. An embodiment of the invention has been shown which illustrates a practical use thereof. These circuits and modifications thereof are to be considered as exemplary and not as limiting the scope of this invention to the specific circuits shown since the invention may be applied to many uses by those skilled in the art.

What is claimed as new is:

1. A pulse amplifier circuit comprising a first amplifier having an input circuit and a high-impedance anode output circuit; a second amplifier having an input circuit and a low-impedance cathode output circuit, the input circuit of said second amplifier being connected to the output circuit of said first amplifier; and a diode, said diode being coupled between said cathode output circuit and said anode output circuit, said diode being poled so as to be conductive when signals in said cathode output circuit are more positive than said anode output circuit, whereby when signals of widely varying dynamic range are applied to the input circuit of said first amplifier, they appear in substantially undistorted greatly amplified form in said cathode output circuit.

2. A pulse amplifier circuit comprising in combination a cathode-follower amplifier having at least a grid, a plate and a cathode; a diode; and a plate-loaded amplifier having at least a grid, a plate, and a cathode; the grid of said cathode follower and the plate of said plate-loaded amplifier being connected together, the junction of said grid and said plate being connected to a source of positive potential through a first load device, the cathode of said cathode follower being connected to an output terminal through a second load device, the plate of said cathode follower being connected to said source of positive potential, the cathode of said plate-loaded amplifier being connected to a ground terminal the grid of said plate-loaded amplifier being connected to an input terminal, said diode being connected between said output terminal and the said junction, whereby signals applied to said input terminal are amplified over a wide dynamic range with a high degree of accuracy and reproduction fidelity.

3. A pulse amplifier circuit comprising in combination a cathode-follower amplifier having at least a grid, a plate and a cathode; a diode; a plate loaded amplifier having at least a grid, a plate, and a cathode; and a feedback resistance network, the grid of said cathode follower and the plate of said plate-loaded amplifier being connected together, the junction of said grid and said plate being connected to a source of positive potential through a first load device, the cathode of said cathode follower being connected to an output terminal through a second load device, the plate of said cathode follower being connected to said source of positive potential, the cathode of said plate-loaded amplifier being connected to a ground terminal the grid of said plate-loaded amplifier being connected to an input terminal, said diode being connected between said output terminal and the said junction, said feedback network being connected between said output terminal and the grid of said plate-loaded amplifier whereby signals applied to said input terminal are amplified over a wide dynamic range with a high degree of accuracy and reproduction fidelity.

4. A pulse amplifier circuit comprising in combination a cathode follower amplifier having at least a grid, a plate and a cathode; a diode; a plate loaded amplifier having at least a grid, a plate, and a cathode; a positive signal limiting means and a negative signal limiting means, the grid of said cathode follower and the plate of said plate loaded amplifier being connected together, the junction of said grid and said plate being connected to a source of positive potential through a first load device, the cathode of said cathode follower being connected to an output terminal through a second load device, the plate of said cathode follower being connected to said source of positive potential, the cathode of said plate loaded amplifier being connected to a ground terminal the grid of said plate loaded amplifier being connected to an input terminal, said diode being connected between said output terminal and the said junction, said positive signal limiting means being connected between a source of positive potential and said junction, the negative signal limiting means being connected between said grid of said plate-loaded amplifier and said output terminal through the network of a source of negative potential connected thereto, whereby signals applied to said input terminal are amplified over a wide dynamic range with a high degree of accuracy and reproduction fidelity.

5. The method of achieving in combination the advantages of the low impedance output of the cathode follower and the high gain characteristic of the anode-loaded amplifier, respectively, in a pulse amplifier, comprising the steps of: applying signal pulses to the input circuit of an anode-loaded amplifier; amplifying the said signal pulses; deriving therefrom an amplified signal-in-a-high-impedance; applying said amplified signal to the input of a cathode-follower amplifier; deriving therefrom a corresponding signal-in-a-low-impedance; conducting that portion of said signal-in-a-low-impedance which is more positive than the signal-in-a-high-impedance back to said input of a cathode-follower amplifier whereby the cathode-follower output signal is maintained to follow exactly the said signal applied thereto.

References Cited in the file of this patent

UNITED STATES PATENTS

| | | |
|---|---|---|
| 2,659,775 | Coulter | Nov. 17, 1953 |
| 2,700,704 | Minter | Jan. 25, 1955 |